United States Patent
Gao

(10) Patent No.: US 7,112,981 B1
(45) Date of Patent: Sep. 26, 2006

(54) METHOD OF DEBUGGING A 3D PACKAGED IC

(75) Inventor: Gengying Gao, Fremont, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/873,983

(22) Filed: Jun. 21, 2004

(51) Int. Cl.
*G01R 31/26* (2006.01)

(52) U.S. Cl. .................................................. 324/765

(58) Field of Classification Search ............... 324/765, 324/763, 760, 158.1; 438/118; 257/777; 361/790, 735
See application file for complete search history.

(56) References Cited

U.S. PATENT DOCUMENTS 6,137,295 A * 10/2000 Yoshida ...................... 324/751
6,753,524 B1 * 6/2004 Matsui et al. ............... 250/310

* cited by examiner

*Primary Examiner*—Jermele Hollington
*Assistant Examiner*—Tung X. Nguyen
(74) *Attorney, Agent, or Firm*—Jurgen Vollrath

(57) ABSTRACT

In a method of testing a 3D packaged IC, the dies are tested under power by mounting on a specifically designed printed circuit board with a window in it for testing the die sequentially from below using a laser beam tester. The die found not to be defective is partially removed in sequential manner to allow the next higher die to be tested. The partial removal of dies is achieved by grinding a window in them using "ChipUnzip" techniques.

20 Claims, 1 Drawing Sheet

METHOD OF DEBUGGING A 3D PACKAGED IC

FIELD OF THE INVENTION

The invention relates to stacked dies and a process for testing stacked dies that are subsequently found to display faulty behavior.

BACKGROUND OF THE INVENTION

An ongoing trend in integrated circuits (ICs) is the attempt to reduce the footprint of the IC. This is addressed, for example, by introducing new processes that allow the gate length to be reduced and thereby allow more transistors to be formed on an IC.

Another recent solution is to provide more than one die in a packaged chip, wherein the dies are stacked on top of each other and separated by an insulating material. This technology in which multiple active dies are stacked inside a single package is commonly referred to as 3D packaging. An example of such a 3D stacked die is shown in FIG. 1, which shows a bottom die 100 extending from its silicon substrate 104, which is, in turn, connected to a die paddle (not shown), which is typically made of copper.

A second die 106 is secured to the bottom die 100 by means of a Teflon based epoxy 108. A third die 110 is secured to the second die 106 by means of a Teflon based epoxy 112. A fourth, or top, die 114 is secured to the third die 110 by means of a Teflon based epoxy 116. It should be noted that the dies 106, 110, 114 in FIG. 1 have substrates too, but their substrates are thinned down to 50 um in this case before assembling. Usually, the substrate thickness of a wafer is 750 um, but is trimmed down to 400 um before it is cut to single chips for assembling as single die ICs. In the case of stacked die, however, the substrates of the dies 106, 110, 114 are thinned out even further.

Each of the dies, 100, 106, 110, and 114 has electrical contacts that are connected electrically by means of bond wires 120 to the silicon substrate 104. The entire structure, comprising the paddle 104, dies, 100, 106, 110, 114, and bond wires 120, are encased in a packaging material, typically referred to as a package (not shown in FIG. 1) and commonly made of a plastics materials. The electrical contacts for each die are typically provided along the die's periphery, and the bond wires are connected to the contacts by means of gold ball bonds (not shown). In order to avoid the top three dies 106, 110, 114 from interfering with the gold ball bonds of the respective dies immediately below them, the upper die can be made ever smaller so that the top die is the smallest, the third die the second smallest, etc. However, in the embodiment shown in FIG. 1, the dies are all the same size, and the epoxy layers 108, 112, 116 between the dies is chosen to be sufficiently thick so as to accommodate the gold ball bonds.

A problem facing the industry is in the testing of such stacked die devices after they have been stacked and packaged. It is common for faulty ICs to be returned by customers to the manufacturer for analysis to determine the root cause of the fault. In the case of non-stacked die this involves the decapping of the IC, i.e. either the top or the back of the package is removed by mechanical grinding or chemical etching. Two common techniques used are wet etch and dry etch. Wet etch includes parallel lapping and acid etching. This removes packaging materials such as plastic, copper, or ceramic. Silicon and metal aluminum will be left and not damaged. Dry etching includes RIE (reactive ion etching) and ChipUnzip (a mechanical grinding method which allows holes of any size and depth to be cut into the IC from its backside). RIE does not remove the packaging materials but serves to remove silicon dioxide. Thus, it is useful for front side electron beam probing. In situations where the bottom metal layers are blocked by the top metal layers, employing RIE to remove silicon dioxide allows operator to view the bottom metal layers from the top of the die.

With the IC exposed, areas of interest in the IC become accessible for testing. However, in the case of a stacked device, there is more than one die. Thus, at least some of the electrical contacts of the lower dies are typically covered by the dies above them and cannot be accessed. Furthermore, it is not possible to isolate the characteristics of individual devices since the functioning of devices on one die is impacted by the devices on the other dies, since the dies are interconnected to allow all of the dies to work as one large IC. This interconnection may take place externally (on the printed circuit board on which the stacked device is mounted) or internally by having vias through the epoxy between the die to thereby allow electrical connection between contacts on one die and contacts of another die. The present invention seeks to provide a way of testing such ICs with 3D packaging.

SUMMARY OF THE INVENTION

According to the invention, a method is provided for testing a 3D packaged integrated circuit (IC) having a plurality of dies mounted on a silicon substrate. The method comprises removing at least part of the packaging, testing a top die by using an electron beam, and testing a bottom die using a laser beam, while the dies are all still physically connected to each other.

The packaging may be removed by making use of wet or dry etching.

Typically the laser beam is a near infrared beam of 1064 nm wavelength.

The method preferably includes thinning out the silicon substrate of the bottom die prior to testing the bottom die, in order to get a better laser image. Preferably the silicon substrate is thinned to 400 um or less using a grinding tool in a method commonly referred to as "ChipUnzip".

Insofar as there are more than two dies stacked on top of each other as part of the IC, the method may further comprise testing dies between the top and bottom dies by opening a window in the bottom die and testing the second lowest die. Typically the second lowest die is tested using a laser beam. The window in the bottom die may be formed by making use of ChipUnzip techniques. Insofar as there are further untested dies above the second lowest die, these are tested sequentially from lowest to highest die by opening up successive windows in the second lowest die followed by any next higher die, and each time testing the die above the die with the window. The testing of the die above the die with the window is typically done using a laser beam.

In order to facilitate testing of the die while power is supplied to the IC and while a signal is fed to the IC, the dies and silicon substrate are preferably secured to a printed circuit board (PCB) and electrical connections provided between electrical contacts on the dies and the PCB. The electrical connections can take the form of electrical wires such as gold or copper wires between the contacts and the PCB. The electrical connections can, instead, include existing bond wires connected between the electrical contacts and the silicon substrate of the bottom die. The PCB may include vias (holes lined or filled with electrically conductive material) extending from a top surface to a bottom surface.

Once a die is located with a defect, it can be separated from any other dies attached to it e.g., by placing whatever is left of the IC into an acid bath, such as 70% HNO3. The method may further comprise parallel lapping the die layer by layer and viewing the die under a scanning electron microscope (SEM) or transmission electron microscope (TEM). The method may also comprise vertical sectioning using a focused ion beam (FIB).

Further, according to the invention, a method is provided for testing a 3D packaged IC having a plurality of dies stacked on top of each other, comprising removing at least part of the packaging, mounting the dies on a PCB having a window in it and testing the dies sequentially from below, starting from the lowest die and working upward by sequentially opening windows in the dies as they are found to be free of defects, thereby providing access to the next higher die. The testing from below may include testing using a laser beam as backside probing system.

DETAILED DESCRIPTION OF THE INVENTION

In one embodiment, the invention proposes testing of 3D packaged ICs by removing the packaging material using standard techniques known in the art, such as wet or dry etching.

Figure 1:
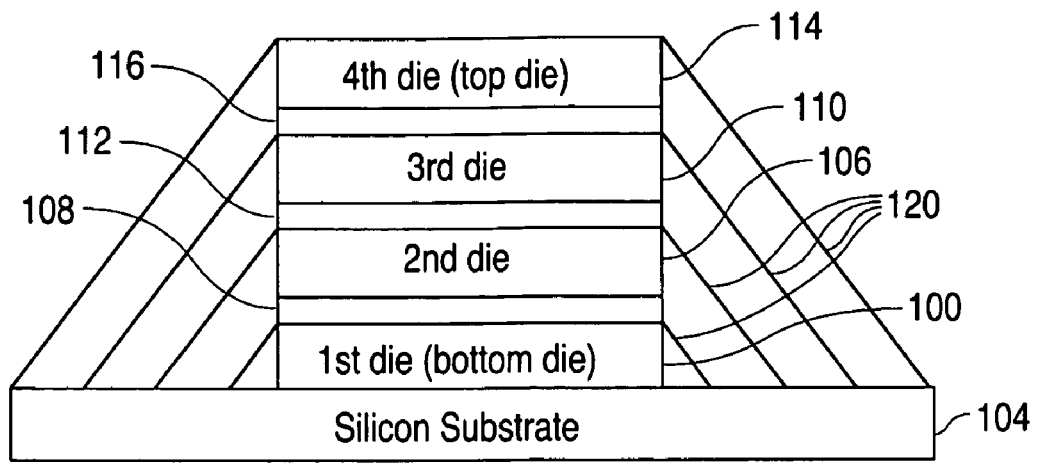
FIG. 1 shows a simplified sectional view of part of a 3D packaged IC as known in the art, with the packaging material removed.

Once the packaging material is removed, the remaining part of the IC in this embodiment will look substantially as shown in FIG. 1.

Figure 2:
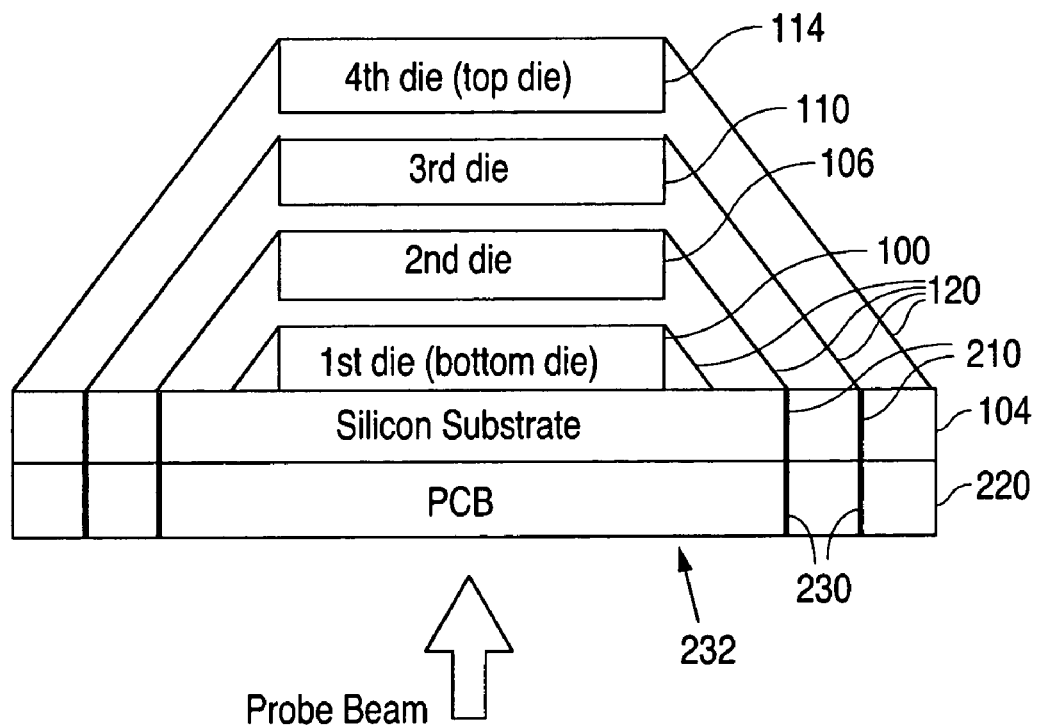
FIG. 2 shows a simplified sectional view of one embodiment of a 3D packaged IC being tested in accordance with the invention.

The present invention will be discussed with respect to the embodiment shown in FIG. 2. For ease of discussion, the same reference numerals are used to define the structural elements in the present embodiment as were used in FIG. 1. Thus, for purposes of this discussion, an IC with four stacked die is considered.

The dies 100, 106, 110, 114, all have metal contacts (not shown) along their periphery or distributed across their lower surface, and electrical signals and power are applied to the dies by means of bond wires 120. The dies are connected together by means of a Teflon based epoxy in this embodiment but different types of adhesives in the form of epoxies and films are known in the art for attaching dies to each other. The bottom die 100 extends from its silicon substrate 104 as shown.

Once the top metal layer of the top die 114 is exposed, in the present embodiment, an electron beam is used to probe the die 114 while power is supplied to the IC and an input signal is fed into the appropriate one or more I/O inputs. The input signal is looped inside the IC and the electron beam focused to different depths to test the various metal layers in the top die 114.

Since the testing is performed while power is supplied to the IC, and a signal is fed into the relevant inputs, it will be appreciated that it is necessary to provide a way of supplying power and the input signal while the IC is mounted on the test equipment. For purposes of testing the top die 114, a regular printed circuit board (PCB) (not shown) can be used in which the IC is either directly mounted on the regular PCB or fits into a socket that is mounted on the regular PCB. The electrical connections between the die contacts and the PCB take place by means of the bond wires 120, which connect the contacts to the silicon substrate 104. The silicon substrate 104, in turn, is mounted on the top of a copper die paddle (not shown) and makes electrical contact with the die paddle by means of vias 210 extending through the silicon substrate 104. The die paddle, in turn, is connected to pins or bumps extending from the IC package. The pins or bumps provide the IC with electrical connection to traces on the PCB. Thus electrical power and signals can be fed to the IC using a regular PCB that would be used during use of the IC. At the same time, in accordance with the invention, an electron beam testing device would test the metal layers of the top die 114. It will be appreciated that the upper die 114 could also be tested using other techniques such as SEM.

When it comes to testing the other dies (dies 100 106, 110), however, one embodiment of the invention, involves testing from the bottom using a laser beam (also referred to as an o-beam), which is typically a near infrared beam. The laser beam is chosen to have a wavelength of 1064 nm which provides the excitation energy corresponding to the bandgap of silicon (1.1 eV). This allows diffusions in the silicon to be probed for defects in a manner known in the art. Before this laser beam probing is done, however, the silicon substrate 104 is thinned to 400 nm or less in this embodiment. Polishing and SiO anti-reflective coating are recommended. Furthermore, in order to be able to mount the IC on a laser beam tester while applying power and a signal to the IC, the thinned silicon substrate 104 of the first die 100 is mounted on a specially created PCB 220 in accordance with the invention. The PCB 220 has a central window to allow the laser beam to probe the die 100 from below. Also, in order to connect the electrical vias 210, which extend through the silicon substrate, to an external connector for providing power and a signal to the IC, the PCB 220 is provided with vias 230 extending from its upper surface to its lower surface 232. The vias 232 take the form of holes that have been lined or filled with a conductive material such as copper, and as shown in FIG. 2, the vias 230 coincide with the vias 210. Electrical traces on the lower surface 232 of the PCB 220 connect the vias 232 to one or more electrical connectors (not shown) on the PCB.

Once the lowest die 100 has been tested and found not to be defective, it is partially removed, in this embodiment, by a mechanical grinding method known in the art as "ChipUnzip". This opens a window in the die 100 to provide access to the die 106. If the die 106 is also found to be without defects, it is in turn removed or a window opened up in it, e.g., by "ChipUnzip" techniques, to provide access from below to the next higher die 110. It will be appreciated that by opening a window in the die 100 rather than removing it completely, it remains attached to the silicon substrate, which in turn, remains attached to the PCB to ensure that the electrical contact are maintained.

In another embodiment, instead of sequentially testing from the bottom up (other than the top die 114) the die could be sequentially tested from the top down, each time removing the next uppermost die if no fault is detected in that die, and testing the next die below it. However, this requires considerable care to avoid damaging the structural devices formed in the dies, since the devices are commonly formed into the upper surface of the silicon material of the die. Thus, removing dies from the top to get to the lower die requires care to avoid damaging the lower dies.

Once a defective die is located, it is separated from any remaining die. One method used to separate the dies was to place whatever was left of the IC into an acid beaker, in this case, 70% HNO3 for 5 to 10 minutes. Thereafter, once the die of interest has been retrieved, since we know the approximate region where the problem is in the die, it is possible to pinpoint the problem by doing additional tests known in the art. For instance, layer after layer of the die can be removed by parallel lapping and the die observed using a scanning electron microscope (SEM) or a transmission electron microscope (TEM). Also, vertical sectioning of the die can be performed using a focused ion beam (FIB) to vertically slice the die.

While the above invention was described with respect to a particular type of 3D packaged IC and using a particular set of steps to test the top die and the other dies in the stacked set of dies, it will be appreciated that the invention applies to other 3D package IC configurations and that variations to the steps can be used without departing from the scope of the invention as defined in the claims. For example, the top die could simply be tested like the die below it by probing from below using a laser beam tester.

What is claimed is:

1. A method of testing a 3D packaged integrated circuit (IC) having a plurality of dies mounted on a silicon substrate, comprising
    removing at least part of the packaging,
    testing a top die using an electron beam,
    testing a bottom die using a laser beam, while the dies are all still physically connected to each other, and
    insofar as there is a second die between the bottom die and the top die, testing the second die by opening a window in the bottom die and testing the second die.

2. A method of claim 1, wherein the method further comprises thinning out the silicon substrate of the bottom die prior to testing the bottom die, in order to get a better laser image.

3. A method of claim 1, wherein the second lowest die is tested using a laser beam.

4. A method of claim 3, wherein the window in the bottom die is formed by making use of ChipUnzip.

5. A method of claim 4, wherein, insofar as there are further untested dies above the second die, these are tested sequentially from lowest to highest die by opening up successive windows in the second die followed by any next higher die, and each time testing the die above the die with the last created window.

6. A method of claim 5, wherein he testing of the die above the die with the last created window is done using a laser beam.

7. A method of claim 6, wherein the dies are secured to a printed circuit board (PCB) and electrical connections provided between electrical contacts on the dies and the PCB.

8. A method of claim 7, wherein the electrical connections take the form of electrical wires between the contacts and the PCB.

9. A method of claim 8, wherein PCB includes vias extending from a top surface to a bottom surface of the PCB.

10. A method of claim 9, wherein, once a die is located with a defect, it is separated from any other dies attached to it.

11. A method of claim 10, wherein the die with the defect is separated by placing whatever is left of the IC into an acid bath.

12. A method of claim 11, wherein the acid bath contains 70% HNO3.

13. A method of claim 10, further comprising parallel lapping the die with the defect layer by layer and viewing the die under a scanning electron microscope (SEM) or transmission electron microscope (TEM).

14. A method of claim 10, further comprising vertical sectioning using a focused ion beam (FIB).

15. A method of claim 9, wherein, once a die is located with a defect, it is separated from any other dies attached to it.

16. A method of claim 1, wherein the dies are secured to a printed circuit board (PCB) and electrical connections provided between electrical contacts on the dies and the PCB.

17. A method of claim 1, wherein the dies are secured to a printed circuit board (PCB) and electrical connections provided between electrical contacts on the dies and the PCB.

18. A method of claim 17, wherein the die with the defect is separated by placing whatever is left of the IC into an acid bath.

19. A method of claim 17, further comprising parallel lapping the die with the defect layer by layer and viewing the die under a scanning electron microscope (SEM) or transmission electron microscope (TEM).

20. A method of claim 17, further comprising vertical sectioning using a focused ion beam (FIB).

* * * * *